United States Patent
Lee et al.

(10) Patent No.: US 9,397,202 B1
(45) Date of Patent: Jul. 19, 2016

(54) METHOD FOR FABRICATING SEMICONDUCTOR DEVICE

(71) Applicant: UNITED MICROELECTRONICS CORP., Hsin-Chu (TW)

(72) Inventors: Hsiang-Chen Lee, Kaohsiung (TW); Ping-Chia Shih, Tainan (TW); Chi-Cheng Huang, Kaohsiung (TW); Wan-Fang Chung, Chiayi (TW); Yu-Chun Chang, Taichung (TW); Je-Yi Su, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 15/077,937

(22) Filed: Mar. 23, 2016

Related U.S. Application Data

(62) Division of application No. 13/909,057, filed on Jun. 3, 2013, now Pat. No. 9,331,183.

(51) Int. Cl.
*H01L 21/336* (2006.01)
*H01L 29/66* (2006.01)
*H01L 21/28* (2006.01)
*H01L 27/115* (2006.01)
*H01L 21/02* (2006.01)
*H01L 21/033* (2006.01)

(52) U.S. Cl.
CPC ...... *H01L 29/66833* (2013.01); *H01L 21/0217* (2013.01); *H01L 21/02164* (2013.01); *H01L 21/02167* (2013.01); *H01L 21/02271* (2013.01); *H01L 21/0332* (2013.01); *H01L 21/28282* (2013.01); *H01L 27/11568* (2013.01)

(58) Field of Classification Search
CPC .......... H01L 27/11568; H01L 29/66833; H01L 29/792; H01L 21/028282; H01L 21/02164; H01L 21/0217; H01L 21/0332; H01L 21/02167
USPC .......... 438/216, 261, 591, 593, 286, 287, 288
See application file for complete search history.

(56) References Cited

U.S. PATENT DOCUMENTS

| | | | |
|---|---|---|---|
| 5,969,383 A | 10/1999 | Chang | |
| 6,545,312 B2 | 4/2003 | Kusumi | |
| 7,709,874 B2 | 5/2010 | Okazaki | |
| 2005/0085039 A1 | 4/2005 | Yasui | |
| 2006/0197145 A1* | 9/2006 | Pittikoun | G11C 16/0483 257/316 |
| 2008/0142876 A1 | 6/2008 | Arigane | |
| 2008/0185635 A1* | 8/2008 | Yanagi | G11C 16/0466 257/325 |
| 2009/0050956 A1 | 2/2009 | Ishimaru | |
| 2010/0059810 A1 | 3/2010 | Homma | |
| 2010/0099246 A1* | 4/2010 | herrick | B82Y 10/00 438/591 |
| 2011/0115009 A1* | 5/2011 | Tan | B82Y 10/00 257/314 |
| 2011/0272753 A1* | 11/2011 | Funayama | H01L 29/42324 257/299 |
| 2013/0181273 A1 | 7/2013 | Charpin-Nicolle | |
| 2014/0264534 A1 | 9/2014 | Tsair | |

* cited by examiner

*Primary Examiner* — Thien F Tran
(74) *Attorney, Agent, or Firm* — Winston Hsu; Scott Margo

(57) ABSTRACT

A method for fabricating semiconductor device is disclosed. Preferably, two hard masks are utilized to define the width of the first gate (may serve for a control gate) and the width of the second gate (may serve for a select gate). The widths are thus well controlled. For example, in an embodiment, the width of the select gate may be adjusted in advance as desired, and the select gate is protected by the second hard mask during an etch process, so as to obtain a select gate which upper portion has an appropriate width. Accordingly the semiconductor device would still have an excellent performance upon miniaturization.

13 Claims, 5 Drawing Sheets

METHOD FOR FABRICATING SEMICONDUCTOR DEVICE

CROSS REFERENCE TO RELATED APPLICATIONS

This application is a division of U.S. application Ser. No. 13/909,057 filed Jun. 3, 2013, and incorporated herein by reference in its entirety.

BACKGROUND OF THE INVENTION

1. Field of the Invention

The present invention relates to a semiconductor technology, and particularly to a semiconductor device and a fabrication method thereof.

2. Description of the Prior Art

In general, there are two basic types of non-volatile memory (NVM) cell structures: stack-gate and split-gate. The stack-gate memory cell usually has a floating gate and a control gate, with the control gate being positioned directly above the floating gate. Recently, MONOS or SONOS structure is also developed to replace floating gate with ONO. In a split-gate structure the control gate is still positioned above the floating gate, but it is offset laterally from it. Another split-gate structure includes for example a select gate formed overlying a portion of a channel region adjacent the source region. The select gate is electrically isolated from a control gate formed overlying a portion of a channel region adjacent the drain region. The select gate controls channel current.

Conventionally, the select gate is formed in a way similar to forming a spacers utilizing an anisotropic etch process, and a width of 1.5 T of a split gate structure can be obtained. As shown in FIG. 1, after a gate structure 12 is formed on a semiconductor substrate 10, a selective gate material layer 14 is deposited. Thereafter, as shown in FIG. 2, undesired portion of the selective gate material layer 14 is removed by etching through a photoresist layer 16. Thereafter, as shown in FIG. 3, an anisotropic etch process is performed to remove the photoresist layer 16, if any left in the previous etch process, and to form a select gate 18 in a spacer shape. Accordingly, the obtained split gate structure can have a width of the width of 1.5 transistors, denoted as 1.5 T. However, because the shape of the select gate relies on the anisotropic properties of the etch process, it is difficult to control the shape finally obtained. Furthermore, as the procedures are similar to those for forming spacers, the upper portion of the obtained select gate always has a width (line width) gradually decreasing toward the top, and it is difficult to increase the width along the upper portion.

In the demands for minimizing the memory device size and fabrication cost, the size of the split gate structure having a select gate is also wanted to be minimized. However, even though the width of the control gate can be decreased in accordance with the minimization of the feature size benefit from an improved process limit in the future, the select gate width may be still limited to an acceptable scale, such that the split gate structure may be unable to meet the desired width of 1.5 T. The reason is if the width of the select gate having a spacer shape is further minimized, the width of the upper portion will be too narrow to maintain its properties or performance. Accordingly, there is still a need for a novel method of forming a split gate structure having a select gate with good performance to meet a demand of a minimized size.

SUMMARY OF THE INVENTION

An objective of the present invention is to provide a semiconductor device and a method of fabricating a semiconductor device, such that the problem that the minimization of whole size must be restricted by an acceptable minimized width of the upper portion of the select gate is solved.

According to an embodiment, a semiconductor device is provided. The semiconductor device includes a first gate structure disposed on a semiconductor substrate, a first spacer and a second spacer disposed on two opposite-to-each-other sidewalls of the first gate structure, and a second gate structure disposed on the semiconductor substrate. The second gate structure is immediately adjacent to the first spacer and not adjacent to the second spacer. A width of a top surface of the second gate structure is not less than a width of a bottom surface of the second gate structure.

According to another embodiment, a method of fabricating a semiconductor device includes steps as follows. A semiconductor substrate is provided. A charge trapping film is formed on the semiconductor substrate. A first gate material layer is formed on the charge trapping film. A first hard mask is formed and patterned on the first gate material layer. The first gate material layer and the charge trapping film are etched through the first hard mask to form a transient first gate structure and a temporary gate structure. A first spacer and a second spacer are formed on a first sidewall of the transient first gate structure and a second sidewall of the temporary gate structure, respectively. The first sidewall and the second sidewall are opposite to each other. A second gate structure is formed between the first spacer and the second spacer. A second mask is formed on the second gate structure, the first spacer and the second spacer. A patterned photoresist layer is formed to partially cover the first hard mask above the transient first gate structure. An etch process is performed through the patterned photoresist layer to remove the first hard mask above the temporary gate structure and the temporary gate structure, and to partially remove the first hard mask above the transient first gate structure and the transient first gate structure to form a first gate structure. The first gate structure is immediately adjacent to the first spacer. The patterned photoresist layer, the first hard mask and the second hard mask are removed.

In the semiconductor device and the fabrication method according to the present invention, two hard masks are utilized to define the width of the first gate (may serve for a control gate) and the width of the second gate (may serve for a select gate). The widths are thus well controlled. For example, in an embodiment, the width of the select gate may be adjusted in advance as desired, and the select gate is protected by the second hard mask during an etch process, so as to obtain a select gate which upper portion has an appropriate width. Accordingly the semiconductor device may still have an excellent performance upon miniaturization.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
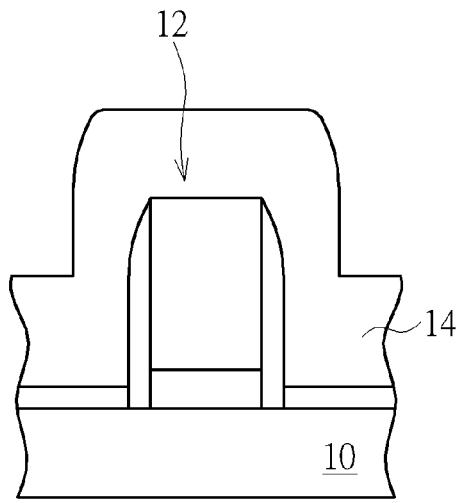
FIGS. 1 to 3 are schematic cross-sectional views illustrating a method of fabricating a select gate according to a conventional technology.
Figure 2:
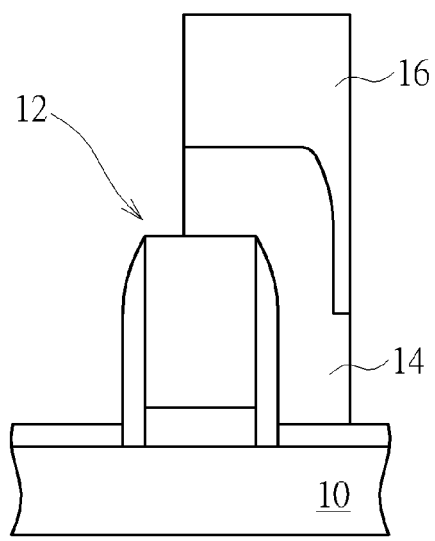
Figure 3:
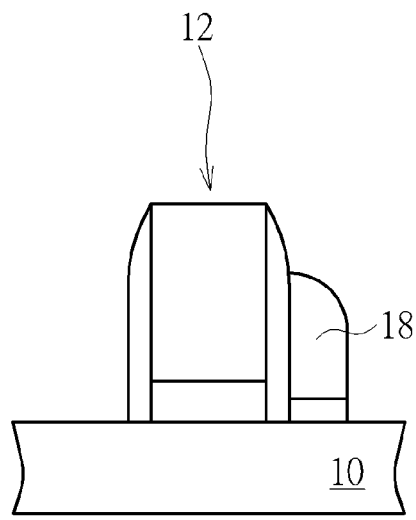
Figure 4:
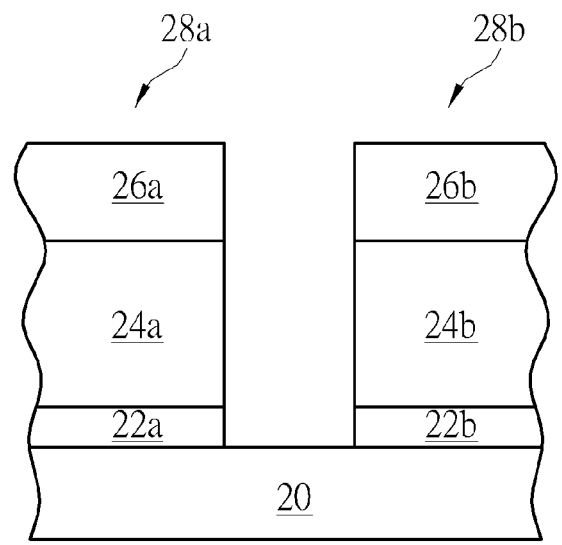
FIGS. 4 to 9 are schematic cross-sectional views illustrating a method of fabricating a semiconductor device according to an embodiment of the present invention.

Please refer to FIGS. 4-9 illustrating a method of fabricating a semiconductor device according to an embodiment of the present invention. As shown in FIG. 4, a semiconductor substrate 20 is provided. A transient first gate structure 28a and a temporary gate structure 28b are formed on the semiconductor substrate 20. The transient first gate structure 28a includes a charge trapping film 22a and a gate material layer 24a. The temporary gate structure 28b includes a charge trapping film 22b and a gate material layer 24b. The semiconductor device may be formed for example as follows. A charge trapping film is formed on the semiconductor substrate 20. Material of the charge trapping film may include, for example, a multilayer of oxide-nitride-oxide (ONO), but be not limited thereto. A gate material layer may be formed on the charge trapping film. The gate material may include for example one or more selected from polysilicon, metal, metal oxide, metal nitride, metal silicide, and the like. The hard mask material layer is formed on the gate material layer through for example a chemical vapor deposition (CVD) process. Material of the hard mask material layer may include for example one selected from $Si_3N_4$, $SiO_2$, SiON, SiC, and SiCN. The hard mask material layer may be patterned through for example a photolithography process and an etch process to form a patterned hard mask having a portion of hard masks 26a and a portion of hard mask 26b. The gate material layer and the charge trapping film are etched through the hard masks 26a and 26b to form gate material layers 24a and 24b and charge trapping films 22a and 22b, respectively.

Figure 5:
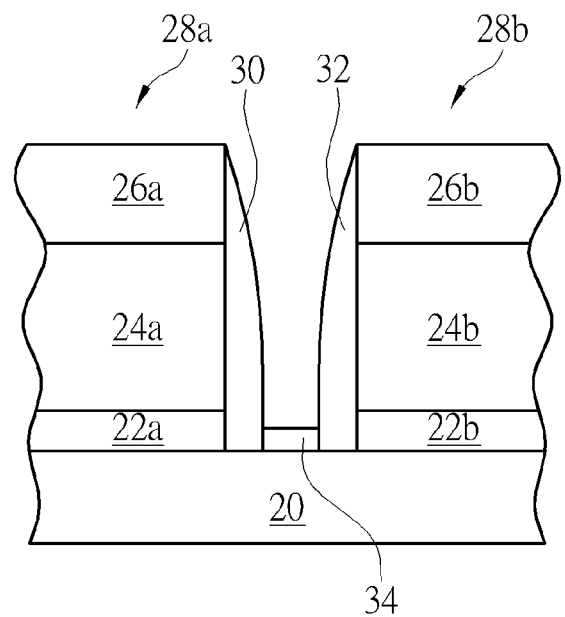

Thereafter, as shown in FIG. 5, the spacer 30 and the spacer 32 are formed on two sidewalls opposite to each other of the transient first gate structure 28a and the temporary gate structure 28b, respectively. The spacers 30 and 32 may be formed through blanketly forming a dielectric layer, such as an oxide layer, by a CVD process and then etching the dielectric layer. Other spacers (not shown) may be also formed on other sidewalls of the transient first gate structure 28a and the temporary gate structure 28b. Because the hard masks 26a and 26b are still on the transient first gate structure 28a and the temporary gate structure 28b, the spacer 30 and the spacer 32 may also cover the sidewalls of the hard masks 26a and 26b. However, it does not affect the structure and the process of the present invention if any of the upper portions of the sidewalls of the hard masks 26a and 26b is not covered with the spacers. A gate dielectric 34 may be formed on the semiconductor substrate 20, if desired, through for example a thermal oxidation process.

Figure 6:
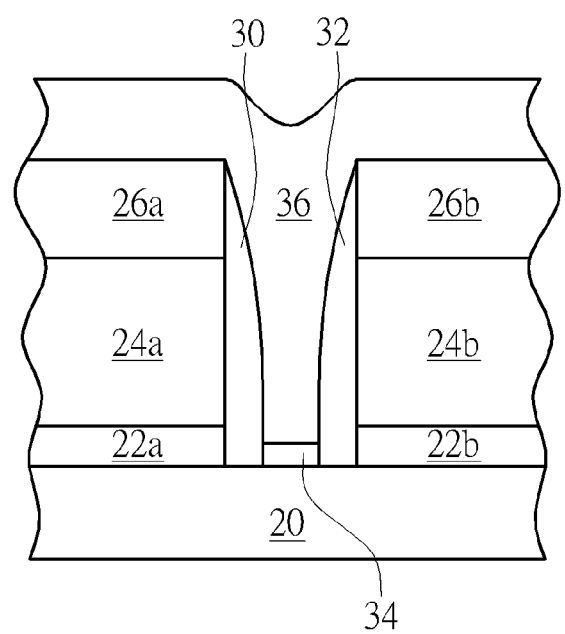

Thereafter, a second gate structure is filled into the space between the spacer 30 and the spacer 32, through for example a deposition process, a planarization process and an etch back process. As shown in FIG. 6, a gate material layer 36 is formed all over, for example, that a polysilicon layer is formed through a CVD process, to cover the semiconductor substrate 20, so as to fill the space between the spacer 30 and the spacer 32 and to extend onto the hard masks 26a and 26b.

Figure 7:
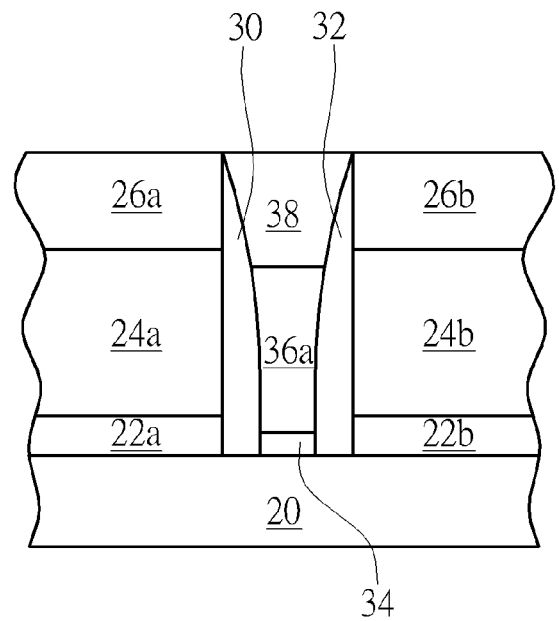

Thereafter, as shown in FIG. 7, a planarization process, such as a chemical-mechanical polishing (CMP) process, is performed and stopped at the hard masks 26a and 26b as a stop layer, to remove the gate material layer on the hard masks 26a and 26b and to planarize the gate material layer between the spacer 30 and the spacer 32. Thereafter, an etch back, such as an anisotropic etch process, is performed to remove a portion of the gate material layer between the spacer 30 and the spacer 32, and the gate material layer 36a having a predetermined or desired height is allow to remain, so as to form a second gate structure. The gate material layer 36a has a height preferably less than the height of the gate material layer 24a. Material of the gate material layer 36a and material of the gate material layer 24a may be the same or different. Thereafter, a hard mask 38 is formed on the second gate structure, the spacer 30, and the spacer 32 through, for example, a CVD process, to form a hard mask material layer filling the space among the second gate structure, the spacer 30 and the spacer 32 and extend onto the hard masks 26a and 26b. Material of the hard mask material layer may include for example one selected from $Si_3N_4$, $SiO_2$, SiON, SiC and SiCN. Thereafter, an etch process is performed to remove the hard mask material layer above the hard masks 26a and 26b to obtain a hard mask 38 having a height the same as the hard mask 26a and 26b. But, the height of the hard mask 38 is not particularly limited. The hard masks 26a and 26b and the hard mask 38 may include the same or different material having the same or different etch rates.

Figure 8:
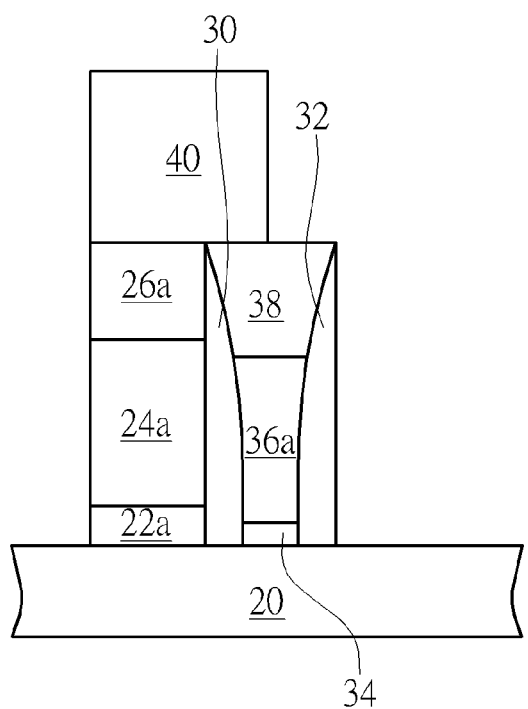

Thereafter, as shown in FIG. 8, a patterned photoresist layer 40 is formed and partially covers the hard mask 26a above the transient first gate structure 28a. The patterned photoresist layer 40 may be formed using a microlithography process. The covered transient first gate structure 28a is the first gate structure wanted to be formed. By etching through the patterned photoresist layer 40, the hard mask 26b not covered by the patterned photoresist layer 40 and the temporary gate structure 28b under the hard mask 26b can be removed, and also the portion of the hard mask 26a not covered by the patterned photoresist layer 40 and the portion of the transient first gate structure 28a under the portion of the hard mask 26a can be removed. The remaining transient first gate structure 28a is the first gate structure located immediately adjacent to the spacer 30. Furthermore, since the first gate structure is formed by performing an anisotropic etch process through the patterned photoresist layer 40, the resulted width of the first gate structure is related to the width of the patterned photoresist layer 40. When the patterned photoresist layer 40 has a width allowed to be the process limit (supposed that it is T) and in the situation that the patterned photoresist layer 40 partially covers the hard mask 26a and extend onto the hard mask 38 having a protection effect, the width of the first gate structure 28a obtained can be less than T.

Figure 9:
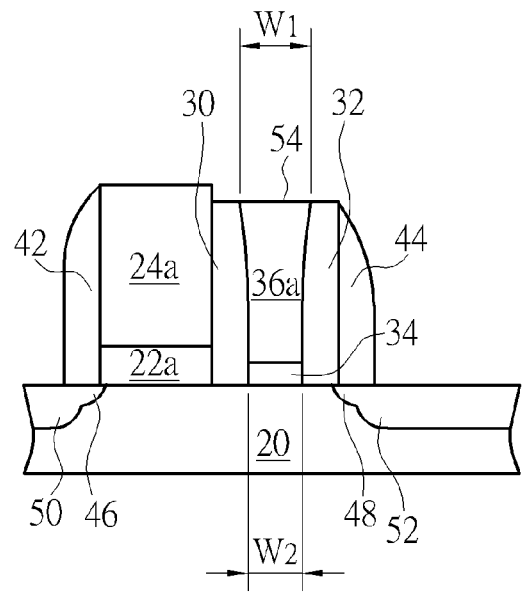

Thereafter, as shown in FIG. 9, the patterned photoresist layer 40, the hard mask 26a and the hard mask 38 are removed. The hard mask 26a and the hard mask 38 may be removed through, for example, a wet etch process.

It is noticed that, regarding the coverage of the patterned photoresist layer 40 as shown in FIG. 8, when the hard mask 26a has an etching rate different from the hard mask 38, in other words, when the hard mask 26a is more easily etched to be removed than the hard mask 38, the hard mask 38 can protect the second gate structure, spacer 30 and spacer 32 thereunder to prevent them from being etched. Accordingly, the patterned photoresist layer 40 can only cover a portion of the hard mask 26a or preferably extend to cover a portion of the hard mask 38, or the entire hard mask 38 if desired. The gate material layer 24a, the spacer 30, and the gate material layer 36a under the hard mask 26a and the hard mask 38 may be damaged due to etch through the joint of the hard mask 26a and the hard mask 38. Accordingly, the patterned photoresist layer 40 is allowed to extend to cover at least a portion of the hard mask 38 in order to further make sure to cover the joint of the hard mask 26a and the hard mask 38. When the hard mask 26a has not an etch selectivity with respect to the hard mask 38, for example, when the hard mask 26a includes the same material as the hard mask 38, the hard mask 26a and the hard mask 38 are both easily etched to be removed. The hard mask 38 cannot protect the second gate structure, spacer 30 and spacer 32 thereunder during the etch process, and, accordingly, the patterned photoresist layer 40 is allowed to not only cover a portion of the hard mask 26a but also extend to cover the entire hard mask 38 for protecting the spacer 30, the gate material layer 36a and the spacer 32 thereunder.

Thereafter, lightly-doped regions 46 and 48 may be formed within the semiconductor substrate 20 beneath the first gate structure 28a and the semiconductor substrate 20 beneath the second gate structure 36a and extend to source/drain regions 50 and 52 after the patterned photoresist layer 40, the hard mask 26a and the hard mask 38 are removed.

Thereafter, a spacer 42 may be formed on another sidewall of the first gate structure 28a after the patterned photoresist layer 40, the hard mask 26a, and the hard mask 38 are removed. In this procedure, a spacer 44 may also formed on the sidewall of the spacer 32 of the second gate structure.

The semiconductor device made by the process described above includes the spacer 30 and the spacer 42 on two sidewalls of the first gate structure 28a. The spacer 30 and the spacer 42 are opposite to each other. The second gate structure 36a is disposed to be immediately adjacent to the spacer 30 and not to the spacer 42. In the unique process according to the present invention, the second gate structure 36a is filled into the space between the spacer 30 and the spacer 32, such that the width $W_1$ of the top surface 54 of the second gate structure 36a will not be less than the width $W_2$ of the bottom surface of the second gate structure 36a. In other words, the width $W_1$ of the top surface 54 of the second gate structure 36a will be greater than or equal to the width $W_2$ of the bottom surface of the second gate structure 36a. Furthermore, with respect to the upper portion of the second gate structure 36a, the width of the upper portion will gradually increase toward the top surface 54, such that the upper portion is in a shape having a gradually enlarged opening with respect to a cross-sectional view as shown by FIG. 9. Furthermore, the top surface of the second gate structure 36a is planar, and this is a great difference from an arc or curve shape which is common for the top surface shape of a conventional spacer-shaped select gate. A spacer 44 may be further formed on the sidewall of the spacer 32 on the sidewall of the second gate structure 36a together to serve as a spacer of the second gate structure 36a.

Figure 10:
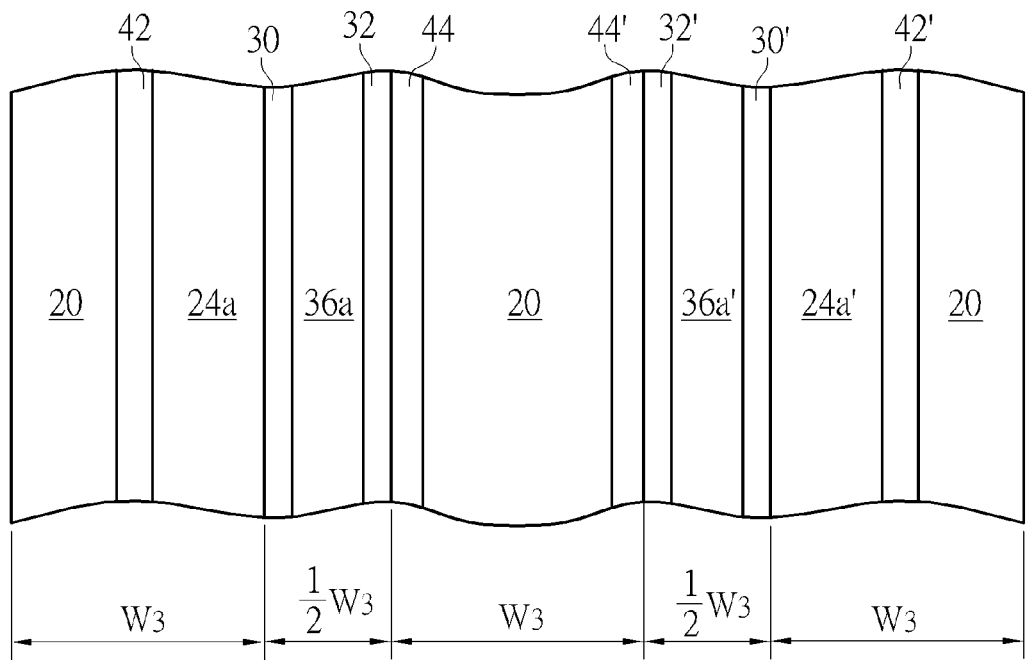
FIG. 10 is a schematic plan view illustrating a semiconductor device according to an embodiment of the present invention.

The above describes a structure of a single semiconductor device according to the present invention. When a plurality of the semiconductor devices each according to the present invention are arranged on a semiconductor substrate, the layout may be as shown by the plan view in FIG. 10, but not limited thereto. As shown in FIG. 10, the gate material layers 24a and 24a' and the gate material layers 36a and 36a' may be each in a bar shape and disposed on the semiconductor substrate 20. A spacer 30 is disposed between the gate material layer 24a and the gate material layer 36a. A spacer 30' is disposed between the gate material layer 24a' and the gate material layer 36a'. A spacer 42 and spacers 32 and 44 are disposed on the outer sidewalls of the gate material layer 24a and the gate material layer 36a, respectively. A spacer 42' and spacers 32' and 44' are disposed on the outer sidewalls of the gate material layer 24a' and the gate material layer 36a', respectively. The drawings show some widths represented using the symbol "$W_3$". The distance of the second semiconductor device from the first semiconductor device may be one T, and the second semiconductor device is arranged as a mirror image of the first semiconductor device. Using the fabrication method according to the present invention, when the line width (feature width) meets the process limit (T), i.e. $W_3$ equals to T, the obtained gate material layer 24a and 24a' each may have a width less than T and the width of each of the gate material layer 36a and 36a' is substantially T/2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a semiconductor substrate;
   forming a charge trapping film on the semiconductor substrate;
   forming a first gate material layer on the charge trapping film;
   forming and patterning a first hard mask on the first gate material layer;
   etching the first gate material layer and the charge trapping film through the first hard mask to form a transient first gate structure and a temporary gate structure;
   forming a first spacer and a second spacer on a first sidewall of the transient first gate structure and a second sidewall of the temporary gate structure, respectively, wherein, the first and second sidewalls are opposite to each other;
   forming a second gate structure between the first spacer and the second spacer;
   forming a second hard mask on the second gate structure, the first spacer and the second spacer;
   forming a patterned photoresist layer partially covering the first hard mask above the transient first gate structure;
   etching through the patterned photoresist layer to remove the first hard mask above the temporary gate structure and the temporary gate structure, and to partially remove the first hard mask above the transient first gate structure and the transient first gate structure to form a first gate structure immediately adjacent to the first spacer; and
   removing the patterned photoresist layer, the first hard mask and the second hard mask.

2. The method according to claim 1, wherein, forming the second gate structure between the first spacer and the second spacer comprises steps of:
   forming a gate dielectric on the semiconductor substrate between the first spacer and the second spacer;
   filling a space between the first spacer and the second spacer with a second gate material layer extending to above the first hard mask;
   performing a planarization process stopping on the first hard mask; and
   etching back the second gate material layer until the second gate material layer has a height lower than a height of the first gate material layer.

3. The method according to claim 1, after removing the patterned photoresist layer, the first hard mask and the second hard mask, further comprising:
   forming a lightly-doped extension region extending to a source/drain region within the semiconductor substrate under the first gate structure and the semiconductor substrate under the second gate structure.

4. The method according to claim 3, further comprising:
   forming a third spacer on another sidewall of the first gate structure.

5. The method according to claim 1, wherein, forming the first gate material layer comprises steps of:

performing a chemical vapor deposition process to form a polysilicon layer serving as the first gate material layer.

6. The method according to claim 1, wherein, forming and patterning the first hard mask on the first gate material layer comprises steps of:

performing a chemical vapor deposition process to form the first hard mask comprising one selected from the group consisting of $Si_3N_4$, $SiO_2$, SiON, SiC and SiCN.

7. The method according to claim 1, wherein, forming the second hard mask on the second gate structure, the first spacer and the second spacer comprises steps of:

performing a chemical vapor deposition process to form the second hard mask comprising one selected from the group consisting of $Si_3N_4$, $SiO_2$, SiON, SiC and SiCN.

8. The method according to claim 1, wherein, the first hard mask and the second hard mask have different etching rates from each other.

9. The method according to claim 1, wherein, the first hard mask and the second hard mask comprise same material and the patterned photoresist layer completely covers the second hard mask.

10. The method according to claim 1, wherein, the patterned photoresist layer completely covers the second hard mask.

11. The method according to claim 1, wherein, the patterned photoresist layer extends from above the first hard mask till to partially cover the second hard mask.

12. The method according to claim 1, wherein, the charge trapping film comprises an ONO multilayer.

13. The method according to claim 1, wherein, removing the first hard mask and the second hard mask comprises performing a wet etch process.

* * * * *